US008068960B2

(12) United States Patent
Wagner

(10) Patent No.: US 8,068,960 B2
(45) Date of Patent: Nov. 29, 2011

(54) CONTROL DEVICE OF AN ADJUSTMENT APPARATUS OF A MOTOR VEHICLE

(75) Inventor: Burkhard Wagner, Ebersdorf (DE)

(73) Assignee: Brose Fahrzeugteile GmbH & Co KG, Coburg, Coburg (DE)

(*) Notice: Subject to any disclaimer, the term of this patent is extended or adjusted under 35 U.S.C. 154(b) by 159 days.

(21) Appl. No.: 12/083,210

(22) PCT Filed: Sep. 22, 2006

(86) PCT No.: PCT/EP2006/009375

§ 371 (c)(1), (2), (4) Date: Apr. 24, 2008

(87) PCT Pub. No.: WO2007/039198

PCT Pub. Date: Apr. 12, 2007

(65) Prior Publication Data

US 2009/0138161 A1 May 28, 2009

(30) Foreign Application Priority Data

Oct. 6, 2005 (DE) ..................... 20 2005 015 869 U

(51) Int. Cl.

| | |
|---|---|
| ***B60R 22/00*** | (2006.01) |
| ***G11C 7/10*** | (2006.01) |
| ***G11C 11/18*** | (2006.01) |
| ***G11C 15/00*** | (2006.01) |

(52) U.S. Cl. ..................... 701/49; 365/189.04; 365/170; 365/49.1

(58) Field of Classification Search .................... 701/49; 365/189.2, 233.13, 189.04, 170, 78, 49.1
See application file for complete search history.

(56) References Cited

U.S. PATENT DOCUMENTS

| | | | | |
|---|---|---|---|---|
| 5,807,283 | A * | 9/1998 | Ng | 600/595 |
| 5,850,131 | A | 12/1998 | Wolfer et al. | |
| 6,972,536 | B2 | 12/2005 | Mukai et al. | |
| 7,295,894 | B2 | 11/2007 | Anderson et al. | |
| 2002/0180389 | A1 | 12/2002 | Filgueiras | |

(Continued)

FOREIGN PATENT DOCUMENTS

DE 35 39 265 A1 5/1987

(Continued)

OTHER PUBLICATIONS

Chu, F., and Davenport, T., "The Endurance Performance of 0.5 micron m FRAM Products", Ramtron International Corporation, Technical Paper, May 2005, p. 1-3 http://www.ramtron.com.*

(Continued)

*Primary Examiner* — James Trammell
*Assistant Examiner* — Muhammad Shafi
(74) *Attorney, Agent, or Firm* — Christie, Parker & Hale LLP

(57) ABSTRACT

A control device of an adjustment apparatus of a motor vehicle for controlling a driven adjustment element of the motor vehicle in an adjustment movement along an adjustment path includes a memory unit with a non-volatile digital memory with more than $10^8$ writing cycles and is configured to acquire a plurality of adjustment data items which are assigned to a position or a speed of the adjustment element along the adjustment path. The control device continuously stores the acquired adjustment data items in the non volatile digital memory when triggered by a triggering process.

15 Claims, 2 Drawing Sheets

U.S. PATENT DOCUMENTS

2006/0239088 A1* 10/2006 Anand et al. .................. 365/200

FOREIGN PATENT DOCUMENTS

| | | | | |
|---|---|---|---|---|
| DE | 199 58 308 | A1 | | 8/2000 |
| DE | EP1148606 | | * | 10/2001 |
| DE | 101 61 434 | A1 | | 6/2003 |
| EP | 0 770 757 | A2 | | 5/1997 |
| EP | 0 950 875 | A1 | | 10/1999 |
| EP | 1 148 606 | A1 | | 10/2001 |
| EP | 1 294 070 | A1 | | 3/2003 |
| EP | 1 487 078 | A2 | | 12/2004 |
| GB | 2221769 | | * | 8/1988 |
| GB | 2 221 769 | A | | 2/1990 |
| WO | WO 2007/004617 | A1 | | 1/2007 |

OTHER PUBLICATIONS

Publication, Prelimiary, FM25W256-256Kb FRAM Wise Voltage Serial Memory, Ramtron International Corporation, Rev.1.1. Mar. 2005, p. 1-13 , http://www.ramtron.com.*

Automotive Engineering,"Focus on electronics", Feb. 2005 aei, p. 44-49.*

International Search Report, dated Feb. 1, 2007, corresponding to PCT/EP2006/009375.

English translation of International Preliminary Report on Patentability dated Apr. 29, 2008 corresponding to PCT/EP2006/009375.

* cited by examiner

CONTROL DEVICE OF AN ADJUSTMENT APPARATUS OF A MOTOR VEHICLE

CROSS-REFERENCE TO A RELATED APPLICATION

This application is a National Phase Patent Application of International Patent Application Number PCT/EP2006/009375, filed on Sep. 22, 2006, which claims priority of German Utility Model Application Number 20 2005 015 869.0, filed on Oct. 6, 2005.

BACKGROUND

The invention relates to a control device of an adjustment apparatus of a motor vehicle.

Such a control device is provided for controlling a driven adjustment element of the motor vehicle in an adjustment movement along an adjustment path, wherein the control device has a memory unit with a non volatile digital memory. The control device is configured to acquire a plurality of adjustment data items which are assigned to a position or a speed of the adjustment element along the adjustment path.

The term "acquisition of adjustment data items" includes both the variant in which adjustment data items in the form of measured values or status data items of a sensor apparatus which is external in relation to the control device and/or an assembly are registered and the variant in which the control device itself has means for generating measured values or for interrogating status data items and therefore measures the adjustment data items.

Such control devices are known from the prior art for the purpose of, in particular, controlling an adjustment apparatus which is embodied as a window lifter system. These control devices are embodied in such a way that the status of the electric assemblies and the position information of the actuated mechanism are stored in the non volatile memory of the control device after the change in position has been concluded or before the control device goes into the sleep mode. If a voltage failure or a reset of the microcontroller which is provided in the control device occurs during the change in position of the mechanism, the current position of the mechanism is no longer known when the control device is next powered up. In the case of a window lifter system, this leads, for example, to what is referred to as destandardization of the window lifter system.

SUMMARY

The present invention is therefore based on the object of providing a control device which overcomes the aforesaid disadvantages in a simple and cost-effective way.

The invention provides that the control device is equipped with a non volatile digital memory with more than $10^8$ writing cycles, wherein the control device continuously stores the acquired adjustment data items in the non volatile digital memory when triggered by a triggering process.

Tying the storage of adjustment data items in a non volatile digital memory to a triggering process ensures that adjustment data items are present up to the time from which no adjustment data items are available any longer owing to voltage dips or voltage failures or because of a system reset.

For this purpose it is advantageous to embody the control device in such a way that a defined time unit during the adjustment movement of the adjustment element and/or a detected movement interval of the adjustment element along the adjustment path is provided as a triggering process.

The memory exemplary has more than $10^9$ writing cycles and a writing time of less than 1 μs. This ensures sufficient resolution of the acquired adjustment data items in terms of time and space over the time period of customary motor vehicle lifetimes.

The adjustment data items can exemplary be stored as data which correlates with the adjustment movement of the adjustment element, said data relating, for example, to position, speed, acceleration and torque of the adjustment element and/or of the adjustment element drive and/or as control signals and/or as measured variables, such as for example mechanical shocks, temperature and the voltage of the vehicle's on board power system, which acts on the adjustment movement.

In a further exemplary embodiment, the control device comprises an interface which is suitable for connection to a bus system for transmitting control signals and/or measurement signals between the control device and sensors which are external in relation to the control device. In particular the CAN/LIN bus systems which are known from the prior art are suitable for this. These bus systems comprise the functionality of the transmission of control signals and/or measurement signals between the control device and sensor apparatuses in the motor vehicle which are arranged externally in relation to the control device.

It is suitable for the non volatile digital memory to additionally store adjustment data items in the form of status data items of the bus system and/or in the form of status data items of functional units which are connected to the bus system.

Furthermore it is advantageous to provide an algorithm which is implemented in the control device and which, when the power supply of the adjustment apparatus fails, extrapolates, by means of at least a number of adjustment data items which are present in the memory, a run on procedure of the adjustment apparatus which interacts with the control device. In this way, the actual position of the adjustment element along the adjustment path after renewed activation of the adjustment apparatus can be determined. For this purpose, the corresponding algorithms are provided in a microelectronic form.

For the non volatile memory, it is possible to use, in particular, memory cells in the form of magnetoresistive RAMs, ferroelectric RAMs and/or phase change RAMs which have the required properties with regard to the number of writing cycles and the writing speed.

An exemplary variant of the invention provides that the control device comprises a timer or interacts with an external timer which is configured in such a way that it triggers the storage of adjustment data items in the memory at defined time intervals.

For this purpose it may be useful if the non volatile memory stores information about the status of the timer as additional adjustment data items.

A further exemplary variant of the control device is defined by the fact that it is embodied with a sensor apparatus for determining position data of the adjustment element. Such a sensor apparatus preferably comprises a Hall sensor. The latter is configured in such a way that a detected edge of a detector signal serves as a triggering process for storing of adjustment data items in the non volatile memory or initiates such a triggering process.

It is advantageous if the non volatile memory stores information about the status of the sensor apparatus as additional adjustment data items.

In a further exemplary variant of the memory unit, there is provision to provide, in addition to the non volatile memory, a volatile RAM memory which serves, in particular, to buffer adjustment data items.

The control device exemplary comprises a microcontroller for controlling the adjustment apparatus and for storing the adjustment data items, wherein the microcontroller is integrated, together with the non volatile memory, in a common component housing.

The control devices mentioned above are suitable, in all their feature combinations, in particular for use for a trapping prevention system of an adjustment apparatus in a motor vehicle. In this context, the functionality for controlling the adjustment element is combined with that of the trapping prevention means.

Likewise, the various control devices can be used for the adjustment elements of adjustment apparatuses which do not have a trapping prevention functionality.

The described control devices are suitable, in particular, for an adjustment apparatus which is embodied as a window lifter system or as a seat adjustment system.

BRIEF DESCRIPTION OF THE DRAWINGS

Further features and advantages of the invention are explained in conjunction with the exemplary embodiments illustrated in the following figures, of which.

DETAILED DESCRIPTION

Figure 1:
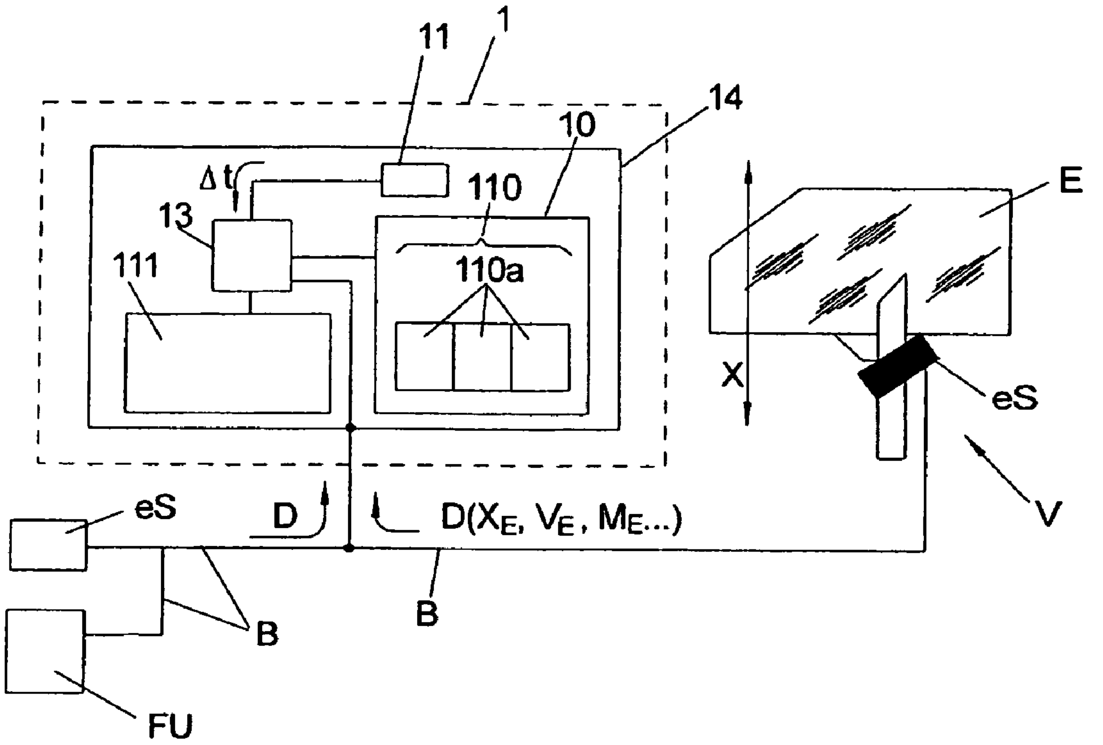
FIG. 1 is a schematic illustration of a first embodiment of a control device 1 with externally arranged sensors eS.

FIG. 1 shows a first embodiment of a control device 1 in a schematic illustration. A microcontroller 13, a memory unit 10 with a non volatile digital memory 110, a timer 11 and a volatile RAM memory 111 are arranged in a common component housing 14. The non volatile memory 110 comprises a plurality of memory cells 110*a*. The microcontroller 13 with the timer 11 is, as a central component, connected to the non volatile memory 110 and the volatile memory 111.

The schematically illustrated components are usually implemented by means of microelectronic components. It is then, of course, possible for the components which are shown separately here to be integrated in terms of their functionality. That is to say the microchip of the microcontroller 13 comprises, for example, the volatile RAM memory 111 and the timer 11.

The control device 1 also comprises an interface for connection to a bus system B. This bus system B operatively connects the control device 1 both to an adjustment apparatus V to be controlled and to further external functional units FU, connected to the bus system B, and/or to external sensors eS.

The adjustment apparatus V shown here by way of example is a window lifter system. An adjustment element E which is embodied as a window pane can move along an adjustment path X in a motor driven fashion. Adjustment data items D, for example in the form of information about the adjustment element E (position $X_E$, speed $V_E$, drive torque $M_E$) can be determined by means of an external sensor eS which interacts with the drive of the adjustment element E, and can be transmitted to the microcontroller 13 of the control device 1 via the bus system B.

Further adjustment data items, for example in the form of measured values of additional external sensors eS and/or status data items of external functional units FU, are available to the microprocessor 13 of the control device via the bus system B which connects all the assemblies. Of course, a uniform bus system is not absolutely necessary. For the provision of adjustment data items it is also conceivable for a plurality of data line systems which are parallel to one another to be provided.

The control device 1 is embodied in such a way that the microcontroller 13 ensures that adjustment data items D are stored in the non volatile memory unit 10 and triggered by a triggering process. The triggering process can, for example, be in the form of a defined time interval Δt. This means that, during a movement of the adjustment element E along the adjustment path X, the respectively current adjustment data items D are stored in the memory unit 10 after the defined time periods Δt. This ensures that, in particular after a voltage dip or after a resetting of the microcontroller 13, destandardization with regard to the position of the adjustment element E of the adjustment apparatus V does not occur. Furthermore, the microcontroller 13 can have an algorithm for simulating the run on behavior of the adjustment element E after a voltage dip and/or after a voltage failure. As a result, it is also possible to prevent destandardization of the adjustment apparatus if the moving adjustment element E runs on for a certain distance of the adjustment path X because of its inertia even after the assigned drive has been switched off before said adjustment element E is braked to a standstill.

Figure 2:
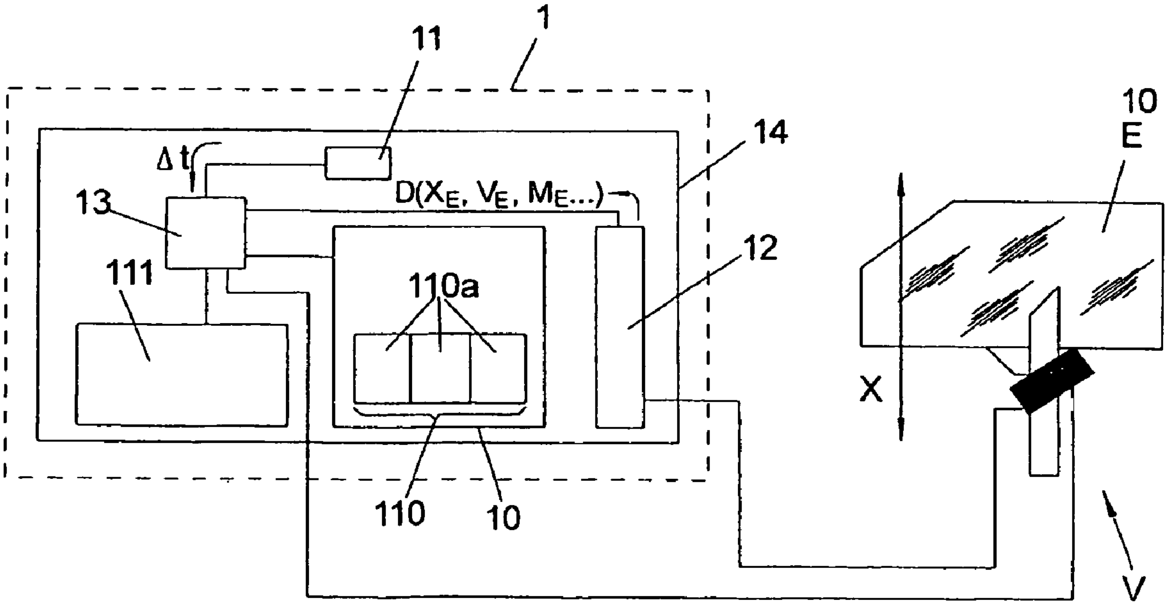
FIG. 2 is a schematic illustration of a second embodiment of a control device 1 with an integrated sensor apparatus 12.

The second embodiment of the control device 1 which is shown in FIG. 2 corresponds in terms of its design, comprising the timer 11, the microcontroller 13, the volatile RAM memory 111 and the non volatile memory unit 10, to the design shown in FIG. 1.

For this reason, reference is made to the statements made above, said statements applying here correspondingly.

In contrast to the first embodiment, the control device 1 comprises a sensor apparatus 12. This sensor apparatus 12 serves to acquire adjustment data items D in the form of measured values relating to the adjustment movement of an adjustment element E of an adjustment apparatus V which interacts with the control device 1. The measuring apparatus, provided as an external sensor eS of the adjustment apparatus V in FIG. 1, for adjustment data items D, in particular in the form of position $X_E$, speed $V_E$, drive torque $M_E$ of the moving adjustment element E, is integrated into the control device 1 here.

In FIG. 2, the connection between the control device 1 and the adjustment apparatus V is not denoted as a bus system. This is merely intended to indicate that the control device 1 can interact with the adjustment apparatus V also via connecting lines other than a bus system. Likewise, it is conceivable for the control device 1 to be integrated structurally into the drive apparatus of the adjustment element E.

Figure 3:
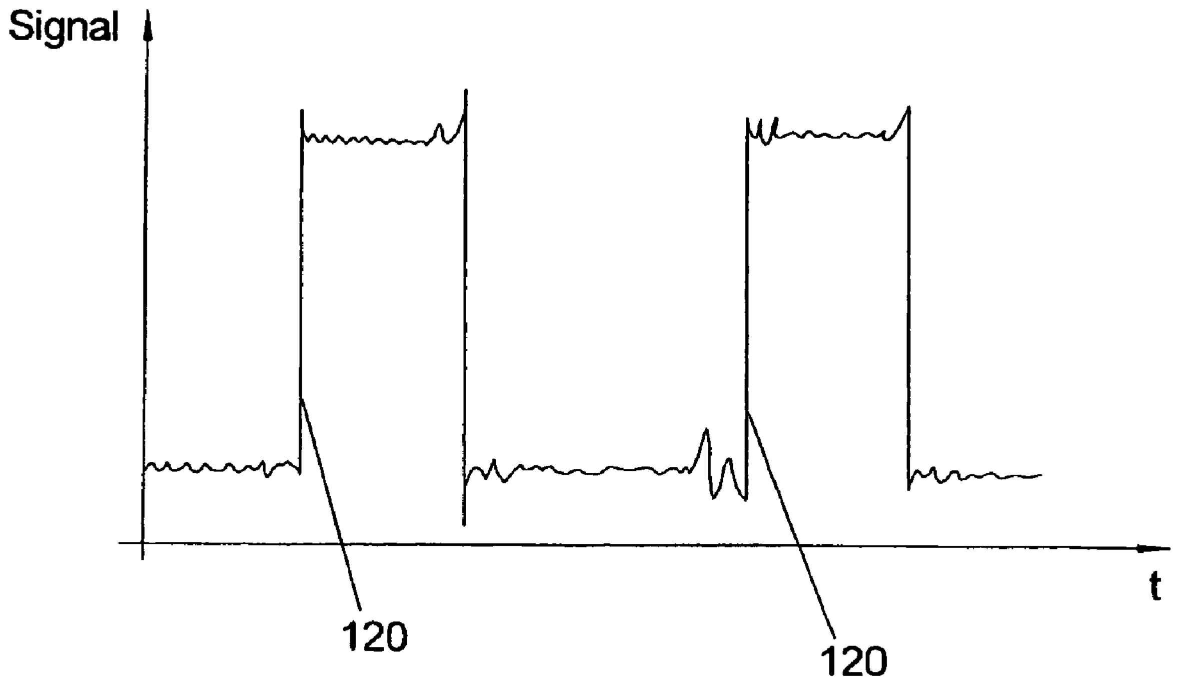
FIG. 3 is a schematic illustration of signal pulses whose rising edges 120 serve as a triggering process for storing adjustment data items D.

As a second variant of a triggering process which triggers the storage of adjustment data items D it is also possible to provide the latter as a sensor signal which represents a characteristic range of the adjustment movement. For example, FIG. 3 illustrates a sequence of Hall sensor pulses. The distance between the rising edges 120 of two pulses corresponds to a defined amount of travel which an adjustment element E has covered along an adjustment path X. If the storage of adjustment data items D in the non volatile memory unit 10 is tied to the illustrated rising edge 120 of a signal pulse which characterizes the movement of the adjustment element E, it is ensured that adjustment data items D are stored as soon as a movement of the adjustment element E occurs.

It is self-evident that the control device 1 can be embodied with a combination of different triggering processes for storing adjustment data items D. Furthermore, it is conceivable to provide different triggering processes as a function of the situation. For example, it is conceivable to store adjustment data items D after respective defined time intervals even when the adjustment element E does not move, it being possible for said adjustment data items to change independently of a movement of the adjustment element E. This relates, in particular, to the operating temperature, the operating voltage and the status data items of other functional units of the motor vehicle.

The invention claimed is:

1. A control device of an adjustment apparatus of a motor vehicle for controlling a driven adjustment element of the motor vehicle in an adjustment movement along an adjustment path, the control device comprising:

a memory unit with a non-volatile digital memory with more than $10^8$ writing cycles and configured to acquire a plurality of adjustment data items assigned to a position or a speed of the adjustment element along the adjustment path;

wherein the control device continuously stores the acquired adjustment data items in the non volatile digital memory when triggered by a triggering process;

wherein the triggering is affected, during an adjustment movement of the adjustment element along the adjustment path, depending on a detected movement interval of the adjustment element along the adjustment path such that the storage is tied to a rising edge of a signal pulse indicative of the adjustment movement; and wherein the triggering is affected, when the adjustment element does not move, depending on a predefined time interval such that the adjustment data items are stored at predefined time intervals.

2. The control device of claim 1, wherein the memory has more than $10^9$ writing cycles and a writing time of less than 1 μs.

3. The control device of claim 1, wherein the control device is configured in such a way that at least one of data correlating with the adjustment movement of the adjustment element and measured variables which act on the adjustment movement and control signals can be stored as adjustment data items.

4. The control device of claim 3, wherein an algorithm is implemented in the control device, wherein when the power supply of the adjustment apparatus fails, the algorithm extrapolates with at least a number of adjustment data items which are present in the memory, a run on procedure of the adjustment apparatus which interacts with the control device.

5. The control device of claim 1, wherein the control device comprises an interface configured for connection to a bus system for transmitting at least one of control signals and measurement signals between the control device and sensors being external in relation to the control device.

6. The control device of claim 5, wherein the memory additionally stores adjustment data items in the form of at least one of status data items of the bus system and status data items of functional units connected to the bus system.

7. The control device of claim 1, wherein the memory has memory cells in the form of at least one of magnetoresistive RAMs, ferroelectric RAMs and phase change RAMs.

8. The control device of claim 1, wherein the control device has a timer configured to trigger the storage of adjustment data items in the memory.

9. The control device of claim 8, wherein the memory stores information about the status of the timer as additional adjustment data items.

10. The control device of claim 1, wherein the control device has a sensor apparatus for determining position data of the adjustment element.

11. The control device of claim 10, wherein the sensor apparatus comprises a Hall sensor configured in such a way that a detected edge of a sensor signal serves as a triggering process for storing adjustment data items.

12. The control device of claim 10, wherein the memory unit stores information about the status of the sensor apparatus as additional adjustment data items.

13. The control device of claim 1, wherein the memory unit has, in addition to the non-volatile memory, a volatile RAM memory.

14. The control device of claim 13, wherein the volatile RAM memory is configured to buffer the adjustment data items in the volatile RAM memory.

15. The control device of claim 1, wherein the control device has a microcontroller for controlling the adjustment apparatus and storing the adjustment data items, wherein the microcontroller is integrated, together with the non volatile memory, in a component housing.

* * * * *